United States Patent [19]
Chawla et al.

[11] Patent Number: 5,187,457
[45] Date of Patent: Feb. 16, 1993

[54] HARMONIC AND SUBHARMONIC FILTER

[75] Inventors: Yogendra K. Chawla, Pittsford, N.Y.; Steven J. Smith, Redwood City, Calif.

[73] Assignee: Eni Div. of Astec America, Inc., Rochester, N.Y.

[21] Appl. No.: 758,569

[22] Filed: Sep. 12, 1991

[51] Int. Cl.$^5$ .............................................. H03H 7/07
[52] U.S. Cl. ..................... 333/170; 333/175; 333/99 PL
[58] Field of Search ............... 333/170, 171, 174, 175, 333/176, 32, 17.3, 99 PL; 315/111.21, 39

[56] References Cited
U.S. PATENT DOCUMENTS

| | | | |
|---|---|---|---|
| 3,569,846 | 3/1971 | Matsuura | 333/170 X |
| 4,375,051 | 2/1983 | Theall | 333/17.3 |
| 4,383,203 | 5/1983 | Stanley | 333/175 X |
| 4,629,940 | 12/1986 | Gagne et al. | 315/111.21 X |
| 4,679,007 | 7/1987 | Reese et al. | 333/32 |

OTHER PUBLICATIONS

H. Paul Shuth, "Interstage 50-Ohm Terminator for VHF Converters"Ham Radio, Feb. 1988.
Matthew Fivash, "Dissipative Filters", RF Design, Oct. 1988, pp. 73-83.

Primary Examiner—Paul M. Dzierzynski
Assistant Examiner—Seung Ham
Attorney, Agent, or Firm—Wall and Roehrig

[57] ABSTRACT

A harmonic and subharmonic filter is coupled between a high power RF energy source and a non-linear RF load via a matching network, such as a plasma chamber. The filter passes high power RF energy in a band centered on a predetermined radio frequency, i.e., 13.56 MHz, but blocks and attenuates out-of-band energy at frequencies which are multiples of or fractions of the predetermined frequency. The harmonic and subharmonic filter comprises an input terminal, an output terminal, a series LC resonance path connected between the input and output terminals, and tuned to the predetermined radio frequency, a series resistive path formed of first and second resistors, and a parallel LC resonance path between the junction of the two resistors and ground.

8 Claims, 2 Drawing Sheets

HARMONIC AND SUBHARMONIC FILTER

BACKGROUND OF THE INVENTION

This invention is concerned with circuitry for the efficient delivery of relatively high-power radio-frequency (RF) energy to a load, such as a plasma chamber or other device. The invention is more particularly concerned with a harmonic filter which absorbs energy at frequencies that vary from a predetermined RF frequency, and more specifically with a filter which protects the RF generator from energy coming back from the plasma chamber at harmonics and subharmonics which may result from application of the RF energy to a non-linear plasma load.

In the art of plasma deposition or sputtering, for example, the process is driven by radio frequency energy typically provided at a frequency of 13.56 MHz at levels up to several kilowatts. Typically, there is an RF generator coupled to a plasma chamber with a matching network interposed between them to match the source plasma generator to the RF generator source impedance which is typically 50 ohms.

Because the plasma does not behave like a linear, ohmic resistance, the application of RF energy to the plasma generator produces out of band energy which can be at multiples of the source frequency (harmonics), or at fractions thereof (subharmonics).

An RF energy delivery system comprising an RF generator, a matching network, and a load is described in U.S. Pat. No. 4,679,007, and generally represents state-of-the-art methodology. A harmonic filter can be interposed in between the generator and the matching network to deal with the problem of out-of-band signals generated by the non-linearity of the plasma load. Previous attempts to do this have generally involved reflective type filters, which reflect rather than absorb harmonics. These previous systems have not dealt adequately with both harmonics and subharmonics. Generally filters of this type have involved a low pass filter followed by a high pass filter in combination with a resistive termination.

Dissipative filters have often been employed in communications work, for example, as a narrow bandpass I.F. filter after the first down converter of a receiver front end. Dissipative filters are employed to improve performance, where it is needed to provide proper controlled termination to the out of band signals. However, dissipative filters have not been favored because they do not offer the sharp attenuation slope of an equivalent lossless filter. Consequently, because of energy dissipation problems, circuit designers have been reluctant to interpose a filter of this type in an RF delivery system where the RF power can be several kilowatts.

OBJECTS AND SUMMARY OF THE INVENTION

Accordingly, it is an object of the invention to provide a rugged, high power band pass filter, for use in a plasma generation or similar non-linear RF load process, which absorbs out-of-band energy with low in-band insertion losses and minimum reflected power for both in-band and out-of-band signals.

It is another object of this invention to provide a filter to absorb RF energy at harmonics and subharmonics of the predetermined frequency at which the RF energy is provided to the plasma chamber or similar load.

A further object is to provide an adequate self-contained harmonic and subharmonic filter module that can be interposed in any of a variety of high power radio frequency applications, where out-of-band energy can be a problem but low insertion loss is a necessity for in-band energy.

According to an aspect of present invention, a harmonic and subharmonic filter is coupled between a source of high-power RF energy that is delivered at a predetermined frequency, e.g. 13.56 MHz, and a non-linear RF load, such as a plasma chamber for a plasma deposition process. An impedance matching network is also be interposed between the filter and the load. The filter is of a dissipative design for absorbing energy at frequencies which are multiples or fractions of the predetermined frequency of the RF source. In several preferred embodiments, the filter has an output terminal connected to the load through a matching network. A series LC resonance path connects the input and output terminals and is tuned to the predetermined RF frequency. A series resistive path is formed of first and second ohmic resistances disposed between the input and output terminals and defining a junction. These resistances should be of a suitable resistance value to match the source and load impedances, and should be rated for dissipating the out-of-band energy as heat. These resistances can each be, for the present example, 50 ohms rated at 250 watts, with suitable heat sink fins to permit air cooling. A parallel LC resonance path is disposed between the junction of the two resistances and RF ground or another point that can be used as a sink for RF energy. The RF energy above or below the predetermined frequency, that is, contained in harmonics and subharmonics, is diverted through both of the resistances and is attenuated.

To obtain a suitable passband but which will eliminate harmonics and subharmonics, the Q factor is chosen to about three for the present example. This means that at the predetermined RF frequency the reactive impedances of the series resonance elements should be about three times the value of the terminating resistances, and the reactive impedances of the parallel resonance elements should be about one-third the value of the terminating resistances. The capacitances of the series and parallel resonance paths can favorably each comprise a bank of fixed capacitors and a variable capacitor, the latter being tunable to fine tune the respective resonance paths to the predetermined RF frequency.

The filter can be configured as a module, within a metal chassis or enclosure, and with the input terminal and output terminal leading into and out of the chassis. A fan or blower is favorably included to force cooling air over the resistance and favorably also over the inductances. A temperature interlock can also be provided to switch the system down if the filter components reach a high temperature (e.g., 150° F. or 65° C.).

A filter according to this invention, capable of handling three kilowatts of RF energy, operates with a maximum VSWR of 3:1, has a maximum insertion loss on the order of 7% of input power, and has a low maximum reflected power on the order of 1% or less of input power, into 50 ohms.

The use of this filter significantly decreases the amplitude of reverse out-of-band signals coming back from the plasma load through the matching network and reaching the RF generator. This improves overall system stability and reliability over a wide range of VSWR conditions.

The above and many other objects, features, and advantages of this invention will become apparent from the ensuing detailed description of a preferred embodiment, to be read in conjunction with the accompanying Drawing.

DETAILED DESCRIPTION OF THE PREFERRED EMBODIMENT

Figure 1:
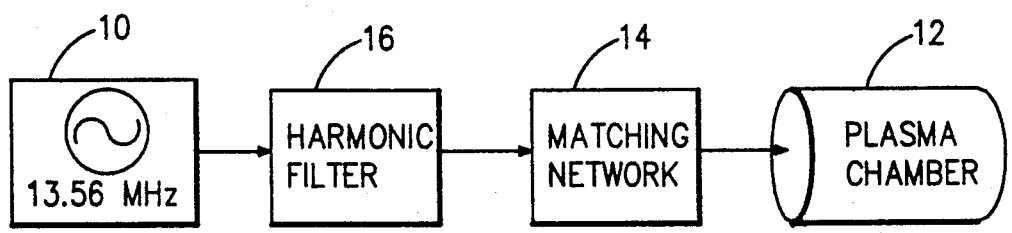
FIG. 1 is a system schematic block diagram of an RF delivery system which employs the harmonic filter according to an embodiment of this invention.
Figure 2:
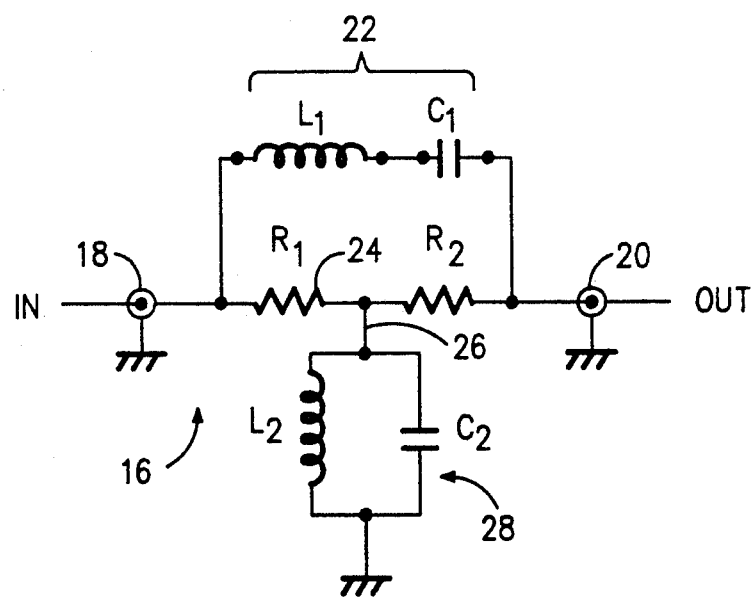
FIG. 2 is a simplified schematic illustrating the harmonic filter of this invention.

With reference to the Drawing and initially to FIG. 1, a system for employing high-power radio frequency (RF) energy comprises an RF generator or power supply 10 providing alternating current at a radio frequency, here 13.56 MHz, at a power of up to 3000 watts for this example. The generator 10 has an effective output impedance of 50 ohms. The RF energy is applied to a plasma chamber 12, which imposes an RF load. The load impedance can vary during operation, and is non-linear, thereby converting some of the input RF energy into energy at frequencies which are multiples or fractions of the 13.56 MHz input frequency. An impedance matching network 14 is interposed between the harmonic filter 16 and the plasma chamber load 12 for matching the impedance of the plasma chamber 12 to the 50 ohms impedance of the RF generator 10. The harmonic filter 16 according to this invention is placed in series with the generator 10 and the matching network 14 for passing energy in a passband centered on the 13.56 MHz frequency, but dissipating energy that is above or below the passband. The harmonic filter is shown schematically in FIG. 2.

As illustrated, the harmonic filter 16 has an input terminal 18 coupled to the RF generator 10 and an output terminal 20 coupled through the matching network 14 to the plasma chamber 12. A series LC resonance path 22 which is tuned to 13.56 MHz is connected between the input and output terminals 18 and 20, and comprises a first inductor $L_1$ and a first capacitor $C_1$. A resistive series path 24 comprises a first ohmic resistor $R_1$ and a second ohmic resistor $R_2$ disposed between the terminals 18 and 20. The resistors $R_1$ and $R_2$ define between them a junction 26. A parallel LC resonance path 28 also tuned to the frequency 13.56 MHz is connected between the junction 26 and ground or another suitable RF energy sink. The parallel resonance path 28 is formed of a second inductor $L_2$ and a second capacitor $C_2$. The resistances $R_1$ and $R_2$ each have a resistance value that equals the impedance (i.e., 50 ohms) appearing at the input and output terminals 18, 20. The resistances $R_1$ and $R_2$ provide non-reflecting dissipating terminations for out-of-band energy, i.e., RF energy above or below 13.56 MHz.

Preferably, the filter is provided with a Q factor of three to provide adequate attenuation of harmonics and subharmonics. In other words, for the series resonance path 22, at the resonance frequency of 13.56 MHz, the first inductor $L_1$ and the first capacitor $C_1$ have respective reactances $X_{L1}$ and $X_{C1}$ as follows:

$$X_{L1} = X_{C1} = 3R_1 = 150 \text{ ohms}.$$

Likewise, the parallel resonance path elements, namely the second inductor $L_2$ and the second capacitor $C_2$ have respective reactance $X_{L2}$ and $X_{C2}$ as follows:

$$X_{L2} = X_{C2} = \tfrac{1}{3} X\ R_1 = 16.67 \text{ ohms}.$$

For passband energy, namely RF energy at the 13.56 MHz frequency, the series path 22 provides a direct connection between the input and output terminals 20. However, for lower frequencies, i.e., subharmonics, the first capacitor $C_1$ appears as an open and the second inductor $L_2$ appears as a short. Likewise, for high frequencies, i.e., harmonics, the first inductor $L_1$ appears as an open, while the second capacitor $C_2$ appears as a short. Therefore, for out-of-band energy, that is, either subharmonics or harmonics generated by the non-linear load of the chamber 12, the resistance $R_2$ provides a 50 ohm dissipating termination between the output terminal and ground. Therefore, substantially all of the passband energy is transferred between the input and output terminals 18, 20 but substantially all of the out-of-band energy is dissipated in the resistive path 24.

Figure 3:
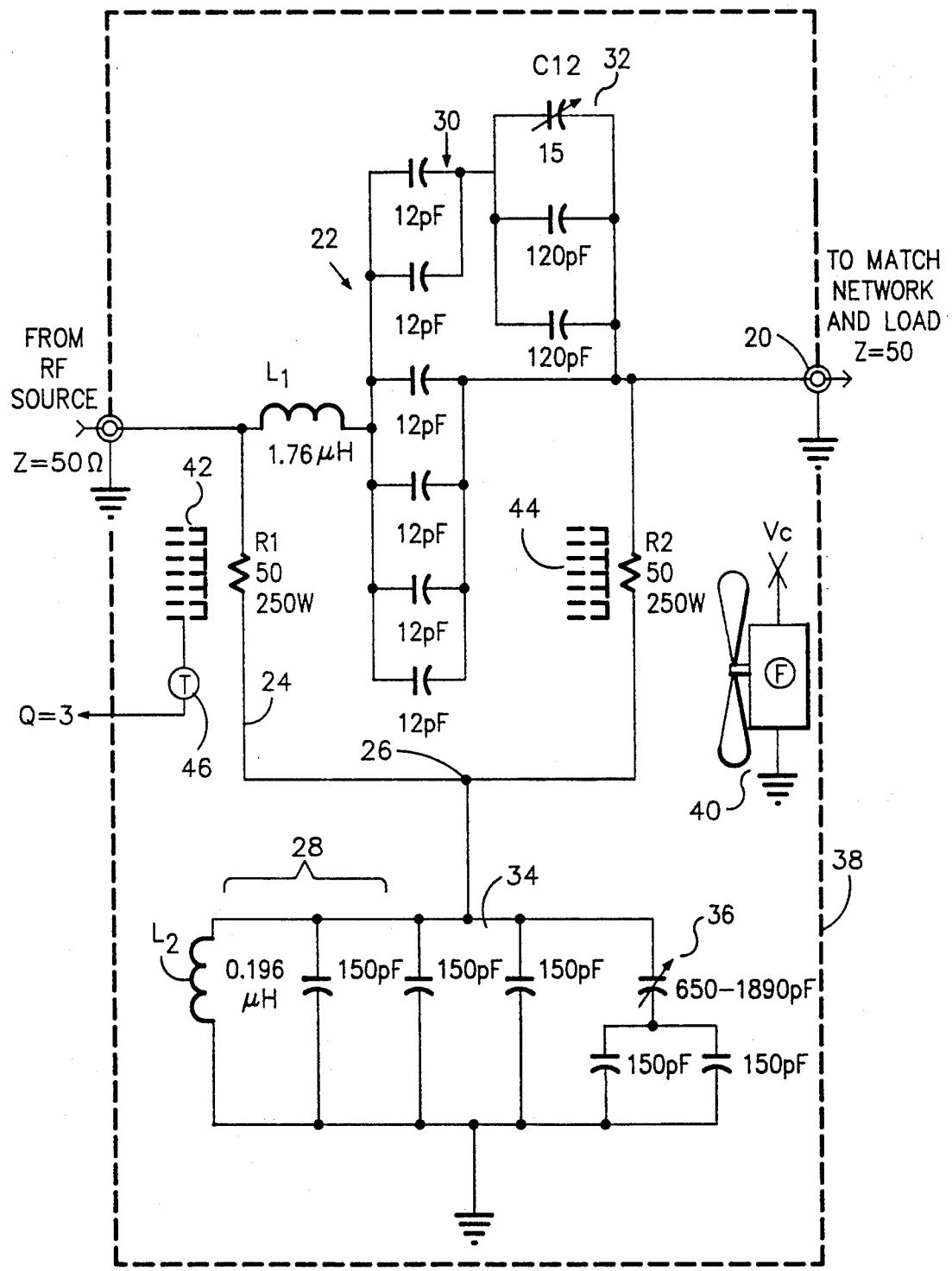
FIG. 3 is a detailed schematic of a harmonic filter according to a preferred embodiment of this invention.

A more specific embodiment of this invention is shown schematically, but in greater detail in FIG. 3. Here, elements that were described earlier in respect to FIG. 2 are identified with the same reference characters.

The series resonance path 22 is shown to comprise the first inductor $L_1$ and the first capacitor $C_1$ which is formed of a bank 30 of the fixed capacitors coupled with a variable capacitor 32. The latter permits fine-tuning of the resonance path 22 to the frequency of the RF generator. The inductor $L_1$ has an inductance of 1.76 $\mu$H and is favorably formed of a wire coil wound with a copper or brass tube, the latter serving as a coil form and also as a heat sink. In the parallel resonance circuit 28, the second inductor $L_2$ has an inductance of 0.196 $\mu$H and is also formed of a wire coil wound with a copper or brass tube. The capacitor $C_2$ is formed of a bank of fixed capacitors 34 in combination with a variable capacitor 36, the latter permitting fine tuning of the parallel resonance path 28.

Here, shown in ghost line, is a metal chassis 38 or enclosure which contains all of the reactive filter components. The input terminal 18 leads into the chassis 38 from the RF generator 10 and the output terminal 20 leads out from the chassis 38 to the matching network 14 and load 12.

A small blower or fan 40, typically with a power draw of ¼ amp at 24 volts dc, provides forced-air cooling to fin-type heat sinks 42 and 44 respectively associated with the resistances $R_1$ and $R_2$ of the resistive path 24. A temperature sensor 46, here shown associated with the heat sink 42, can be coupled to an interlock switch (not shown) which can shut off the RF generator 10 if the heat sink 42 rises above a predetermined temperature, e.g. 65° C. or 150° F. This temperature is above the normal operating range of 0° C. to 45° C.

Various modifications of this harmonic filter are possible depending on the intended application. For example, the resistors, inductors, and capacitors can be matched to an impedance other than 50 ohms, if appropriate.

The harmonic filter can also be employed in other high-power, high-frequency applications besides plasma generation, where a non-linear load is likely to result and out-of-band controlled termination is required.

While this invention has been described in detail with reference to a preferred embodiment, it should be understood that the invention is not limited to that precise embodiment. Rather, many modifications and variations would present themselves to those of skill in the art without departing from the scope and spirit of this invention, as defined in the appended claims.

What is claimed is:

1. A harmonic and subharmonic filter coupled between a high power RF energy source and a non-linear RF load for passing said high power RF energy in a band centered on a predetermined radio frequency and blocking and attenuating energy at out-of-band frequencies which include multiples of said predetermined frequency or fractions of said predetermined frequency,
   the harmonic and subharmonic filter comprising
   an input terminal coupled to said source;
   an output terminal coupled via an impedance matching network to said load;
   a series of LC resonance path connected between said input and output terminals and tuned to said predetermined radio frequency;
   a series resistive path formed of a first ohmic resistance and second ohmic resistance in series between said input and output terminals and having a junction therebetween; and
   a parallel LC resonance path between said junction and a radio frequency sink, such that energy above or below said predetermined frequency is diverted through one or both of said resistances and is attenuated,
   wherein at said predetermined radio frequency said series resonance path has a capacitive reactance and an inductive reactance each substantially three times the value of each of said first and second resistance, and said parallel resonance path has a capacitive reactance and an inductive reactance each substantially one third the value of each of said first and second resistances.

2. The harmonic and subharmonic filter according to claim 1 wherein said first and second resistances have a value of substantially 50 ohms and a power dissipation capacity on the order of 250 watts.

3. A harmonic and subharmonic filter coupled between a high power RF energy source and a non-linear RF load for passing said high power RF energy in a band centered on a predetermined radio frequency and blocking and attenuating energy at out-of-band frequencies which include multiples of said predetermined frequency or fractions of said predetermined frequency,
   the harmonic and subharmonic filter comprising
   an input terminal coupled to said source;
   an output terminal coupled via an impedance matching network to said load;
   a series LC resonance path connected between said input and output terminals and tuned to said predetermined radio frequency;
   a series resistive path formed of a first ohmic resistance and second ohmic resistance in series between said input and output terminals and having a junction therebetween; and
   a parallel LC resonance path between said junction and a radio frequency sink, such that energy above or below said predetermined frequency is diverted through one or both of said resistances and is attenuated,
   wherein said first and second resistances have a value of substantially 50 ohms and a power dissipation capacity on the order of 250 watts; said resistances are disposed in thermal contact with respective fin-type heat sinks; and
   further comprising a blower for moving cooling air past said heat sinks and said first and second resistances to remove dissipative energy converted to heat in said resistances.

4. A harmonic and subharmonic filter coupled between a high power RF energy source and a non-linear RF load for passing said high power RF energy in a band centered on a predetermined radio frequency and blocking and attenuating energy at out-of-band frequencies which include multiples of said predetermined frequency or fractions of said predetermined frequency,
   the harmonic and subharmonic filter comprising
   an input terminal coupled to said source;
   an output terminal coupled via an impedance matching network to said load;
   a series LC resonance path connected between said input and output terminals and tuned to said predetermined radio frequency;
   a series resistive path formed of a first ohmic resistance and second ohmic resistance in series between said input and output terminals and having a junction therebetween; and
   a parallel LC resonance path between said junction and a radio frequency sink, such that energy above or below said predetermined frequency is diverted through one or both of said resistances and is attenuated,
   wherein said series resonance path includes a first coil in series with a first capacitor bank and said parallel resonance path includes a second coil in parallel with a second capacitor bank, said capacitor banks including a plurality of fixed capacitors and a respective variable capacitor for fine tuning the respective resonance path to said predetermined radio frequency.

5. The harmonic and subharmonic filter according to claim 1 wherein said source provides said RF energy at a power on the order of three kilowatts at said radio frequency of 13.56 MHz.

6. The harmonic and subharmonic filter according to claim 1 further comprising a metal chassis enclosing said series and parallel resonance paths and said resistive path, with said input terminal and output terminal leading into and out of said chassis.

7. The harmonic and subharmonic filter according to claim 4 wherein said first and second resistances have a value of substantially 50 ohms and a power dissipation capacity on the order of 250 watts.

8. In combination, a high-power radio frequency source providing radio frequency energy at a predetermined radio frequency and with a power output on the order of several kilowatts; an RF load having in input coupled to said power output of said radio frequency source, the RF load having an impedance that varies during operation and is non-linear thereby converting some of said radio frequency energy into energy at frequencies which are multiples or fractions of said predetermined radio frequency; and a harmonic and subharmonic filter interposed between the output of said source and the input of said load, said filter comprising:

an input terminal coupled to said source;
an output terminal coupled via an impedance matching network to said load;
a series LC resonance path connected between said input and output terminals and tuned to said predetermined radio frequency;
a series resistive path formed of a first ohmic resistance and a second ohmic resistance in series between said input and output terminals and having a junction therebetween; and
a parallel LC resonance path between said junction and a radio frequency sink, such that energy above or below said predetermined frequency is diverted through one or both of said ohmic resistances and is attenuated.

* * * * *